United States Patent
Devison et al.

(10) Patent No.: US 9,179,411 B2
(45) Date of Patent: Nov. 3, 2015

(54) SYSTEM AND METHOD FOR CONTROLLING ENVELOPE TRACKING IN A TRANSMITTER WITH CLOSED LOOP POWER CONTROL

(71) Applicant: BLACKBERRY LIMITED, Waterloo (CA)

(72) Inventors: Stephen Arnold Devison, Kitchener (CA); Christopher Eugene Snyder, Waterloo (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 209 days.

(21) Appl. No.: 13/940,484

(22) Filed: Jul. 12, 2013

(65) Prior Publication Data

US 2015/0017931 A1    Jan. 15, 2015

(51) Int. Cl.
*H01Q 11/12* (2006.01)
*H04B 1/04* (2006.01)
*H04W 52/02* (2009.01)
*H04W 52/04* (2009.01)

(52) U.S. Cl.
CPC .......... *H04W 52/0261* (2013.01); *H04W 52/04* (2013.01); *H04B 2001/0408* (2013.01)

(58) Field of Classification Search
CPC .......... H03F 3/24; H03F 3/189; H03F 3/211; H03F 2200/451; H03F 2200/504; H04B 1/04; H04B 1/40; H04B 17/13; H03G 3/00; H03G 3/20; H03G 3/3042; H04W 52/52; H04W 72/0473

USPC .......... 455/95, 114.2, 127.1, 127.2, 572, 574; 375/296, 297

See application file for complete search history.

(56) References Cited

U.S. PATENT DOCUMENTS

| | | | |
|---|---|---|---|
| 7,551,688 B2 * | 6/2009 | Matero et al. | 375/297 |
| 8,457,246 B2 * | 6/2013 | Kim et al. | 375/295 |
| 8,649,746 B2 * | 2/2014 | Kang et al. | 455/127.1 |
| 8,824,981 B2 * | 9/2014 | Langer et al. | 455/127.1 |
| 2011/0058601 A1 | 3/2011 | Kim et al. | |

FOREIGN PATENT DOCUMENTS

| GB | 2488119 A1 | 8/2012 |
|---|---|---|
| WO | 2012151594 A2 | 11/2012 |

OTHER PUBLICATIONS

Corresponding European Patent Application No. 13176401.1 Search Report dated Oct. 9, 2013.

* cited by examiner

*Primary Examiner* — Quochien B Vuong
(74) *Attorney, Agent, or Firm* — Perry + Currier, Inc.

(57) ABSTRACT

A system and method for controlling envelope tracking in a transmitter with closed loop power control, including up-converting and pre-amplifying a baseband signal to a pre-amplified RF signal, amplifying the pre-amplified RF signal, converting the envelope of the baseband signal into a shaped envelope signal, adjusting the gain of the pre-amplified RF signal, and adjusting the shape of the envelope signal in response to changes in the gain of the pre-amplified RF signal.

19 Claims, 3 Drawing Sheets

SYSTEM AND METHOD FOR CONTROLLING ENVELOPE TRACKING IN A TRANSMITTER WITH CLOSED LOOP POWER CONTROL

TECHNICAL FIELD

Example embodiments relate to controlling envelope tracking in a transmitter with closed loop power control, and more particularly to coordinating automatic power control and signal envelope tracking in a transmitter.

BACKGROUND

Radio-frequency (RF) mobile communication devices typically employ power saving techniques to increase battery life. Because the transmitter power amplifier of a mobile communication device consumes a large percentage of the overall power utilized by the device, various power management systems are used to increase the overall power efficiency of the power amplifier.

One such system adjusts the transmission power of a mobile communication device in order to utilize the least amount of power necessary to maintain signal quality while minimizing interference between different wireless networks within range of the device. The use of closed automatic power control (APC) loops may be used to control power changes from one desired power level to another within the transmitter of the mobile communication device. For example, in response to receipt of a command from a cellular base station to reduce transmission power, it is known in the art to employ an APC loop between a transmitter output stage and a power amplifier of the transmitter for controlling gain and bias settings of the transmitter output stage.

Envelope tracking (ET) is another power management system known in the art, for adjusting the power supply voltage applied to the power amplifier so that the amplifier operates at peak efficiency for given instantaneous output power requirements. In operation, the voltage supplied to the power amplifier is synchronized with the envelope of the RF signal passing through the transmitter, thereby reducing unused energy that would otherwise be dissipated as heat.

In conventional envelope tracking (ET) transmitters, the gain applied to the ET signal path is scaled in response to a power step (e.g. using a table lookup) and applied to an ET modulator immediately before closing the APC loop. However, step-wise gain adjustment (scaling) of the ET signal path can result in spectral anomalies before the APC loop is closed, which persist until the APC loop has stabilized.

Reference will now be made to the exemplary embodiments illustrated, and specific language will be used herein to describe the same. It will nevertheless be understood that no limitation of the scope of protection is thereby intended.

DETAILED DESCRIPTION OF EXAMPLE EMBODIMENTS

In accordance with an example embodiment, there is provided a transmitter for a mobile communication device, comprising: a processor for generating a baseband signal and a control signal; a transmit signal path having a modulator for up-converting the baseband signal to an RF signal, and a transmit output stage for pre-amplifying the RF signal; a power amplifier for amplifying the pre-amplified RF signal; an antenna for transmitting the amplified RF signal; an envelope tracking signal path having a function block for converting the envelope of the baseband signal into a shaped envelope signal; an automatic power control loop for receiving the control signal from the processor and in response controlling the gain of the transmit output stage and the shape of the envelope signal from the envelope tracking signal path; and an envelope tracking modulator for receiving the envelope signal and synchronizing power applied to the power amplifier therewith.

According to another aspect, there is provided an improvement in a transmitter for a mobile communication device having a transmit signal path for up-converting and pre-amplifying a baseband signal to a pre-amplified RF signal, a power amplifier for amplifying the pre-amplified RF signal, and an envelope tracking signal path for converting the envelope of the baseband signal into a shaped envelope signal, and an automatic power control loop for controlling the gain of the transmit output stage, the improvement comprising coupling the envelope tracking signal path and the transmit signal path so that the shape of the envelope signal is adjusted in response to changes in the gain of the transmit output stage.

According to a further aspect, there is provided a method for controlling envelope tracking in a transmitter with closed loop power control, comprising up-converting and pre-amplifying a baseband signal to a pre-amplified RF signal; amplifying the pre-amplified RF signal; converting the envelope of the baseband signal into a shaped envelope signal; adjusting the gain of the pre-amplified RF signal; and adjusting the shape of the envelope signal in response to changes in the gain of the pre-amplified RF signal.

Figure 1:
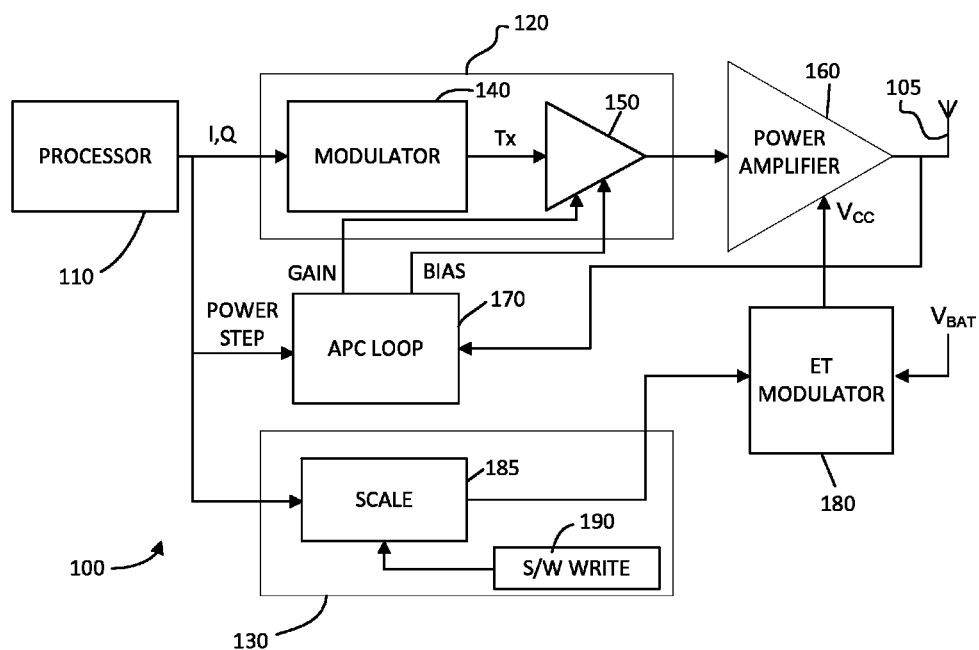
FIG. 1 is an illustration of a block diagram of a prior art transmitter incorporating automatic power control and signal envelope tracking.

With reference to FIG. 1, a prior art transmitter 100 is shown that can, in some embodiments, form the transmit portion of a communication subsystem of a mobile communication device (not shown). Such a communication subsystem may also include a receive portion for receiving electromagnetic signals.

A data signal that is to be transmitted using the transmitter 100 is typically a comparatively low frequency signal that is generally referred to as a baseband signal. The baseband signal is mixed with a carrier signal having a substantially higher frequency, as discussed below, to produce a transmission signal. The transmission signal is then amplified and radiated by an antenna 105. The amplified transmission signal is preferably sufficiently amplified so that it is received with little or no data loss at a remote base station or another communication device.

Transmitter 100 includes a processor 110, that acts as a controller for a transmit path 120 and envelope tracking (ET) path 130. For example, the gains applied to communication signals in transmitter 100 may be adaptively controlled using automatic power control (APC) algorithms and envelope tracking algorithms implemented in the processor 110, as described in greater detail below.

Transmit path 120 includes a modulator 140 and a transmit output stage 150. Processor 110 also provides the in-phase and quadrature baseband signal (I, Q) to modulator 140.

Although not shown, and as would be understood by a person of skill in the art, modulator 140 typically includes a pair of modulator stages that are driven by a local oscillator that generates a high-frequency carrier signal, for frequency up-converting the baseband signal (I, Q) to a transmission signal (Tx).

The transmit output stage 150 functions as a variable gain amplifier and typically has a broad power range. The transmit output stage 150 received the up-converted transmission signal (Tx) and produces a pre-amplified transmission signal to a power amplifier 160 whose output is connected to antenna 105. The gain of the output stage is varied to provide an amount of gain dependent upon the desired power level for the amplified transmission signal. The gain of the transmit output stage 150 is dictated by an automatic power control loop, APC 170, as discussed in greater detail below. The power amplifier 160 amplifies the pre-amplified transmission signal to provide the remainder of the required gain, and passes the amplified radio frequency (RF) signal to antenna 105.

The antenna 105 may be embedded or internal to the mobile communication device, and formed of at least some conductive material for receiving or transmitting (or both) of electromagnetic signals.

The power amplifier 160 can provide a substantial gain, but typically has a smaller power gain than transmit output stage 150. It will be understood to a person skilled in the art that the power amplifier 160 may include one or multiple amplification stages.

In operation, in response to receiving a power step command (i.e. a control signal from processor 110 indicating a desired change in power setting (typically in steps of 1 dB-30 dB)), APC loop 170 continuously adjusts the gain and/or bias of the analog transmit output stage 150 so as to smoothly transition between power levels. Typically, the APC 170 loop includes a power controller that is driven by a reference signal, and a feedback signal tapped (usually via a power coupling device) from the output of power amplifier 160. One example of such a power controller is a proportional-integral-derivative (PID) controller. The feedback signal from the power amplifier 160 is compared to the reference signal in the power controller, which then attempts to minimize the error in the loop by applying "a corrective signal" (gain, bias) to the analog transmit output stage 150 in the feedforward transmit path 120. Depending on the range of the gain setting, a new bias range can be selected in order to reduce current.

The envelope tracking (ET) path 130 can be used to convert envelope or amplitude data associated with the baseband (I, Q) signal into shaped envelope data for application to an ET modulator 180. Shaping the envelope data from the baseband processor 110 can aid in enhancing performance of the power amplifier system 160 by, for example, adjusting the envelope signal to optimize linearity of the power amplifier 160 and/or to achieve a desired gain compression of the power amplifier 160. In certain implementations, the ET path 130 comprises a digital block having a digital scale function 185 and software write 190 to convert shaped envelope data into an analog envelope signal suitable for use by the ET modulator 180.

The ET modulator 180 receives the envelope signal from the ET path 130 and a battery voltage $V_{BAT}$, and uses the envelope signal to generate a power amplifier supply voltage $V_{CC}$ for the power amplifier 160 that changes in relation to the envelope. The power amplifier 160 receives the RF signal from the transmit path 120, and provides an amplified RF signal to the antenna 105, as discussed above.

It is desirable that the gain of the envelope tracking (ET) path 130 track gain changes in the transmit path 120 in order to maintain output signal quality. However, in the prior art transmitter of FIG. 1, operation of the transmit path 120 and ET path 130 are independent. Thus, in the event of a power step, (i.e. a change in required power output of the transmitter 100), the baseband signal (I, Q) in the ET path 130 undergoes static gain adjustment via operation of the digital scale function 185 and software write 190 before the APC loop 170 closes (i.e. stabilizes to the new power setting). Thus, when changing the gain in the transmit path 120 between two power levels, stepping the gain in the ET path 130 can lead to undesired compression and power discontinuities of the transmitted output signal during the transition between the two power levels, resulting in undesired spectral distortion of the radiated signal until the APC loop 170 is closed.

More specifically, between the time that the software write 190 begins scaling down the ET gain and the time that the APC loop 170 closes (stabilizes), the spectrum of the radiated signal is subjected to uncontrollable distortion. Thus, FIG. 2 shows a transmitter incorporating automatic power control and signal envelope tracking in accordance with an example embodiment, wherein like reference numerals denote like elements of the transmitter illustrated in FIG. 1.

Figure 2:
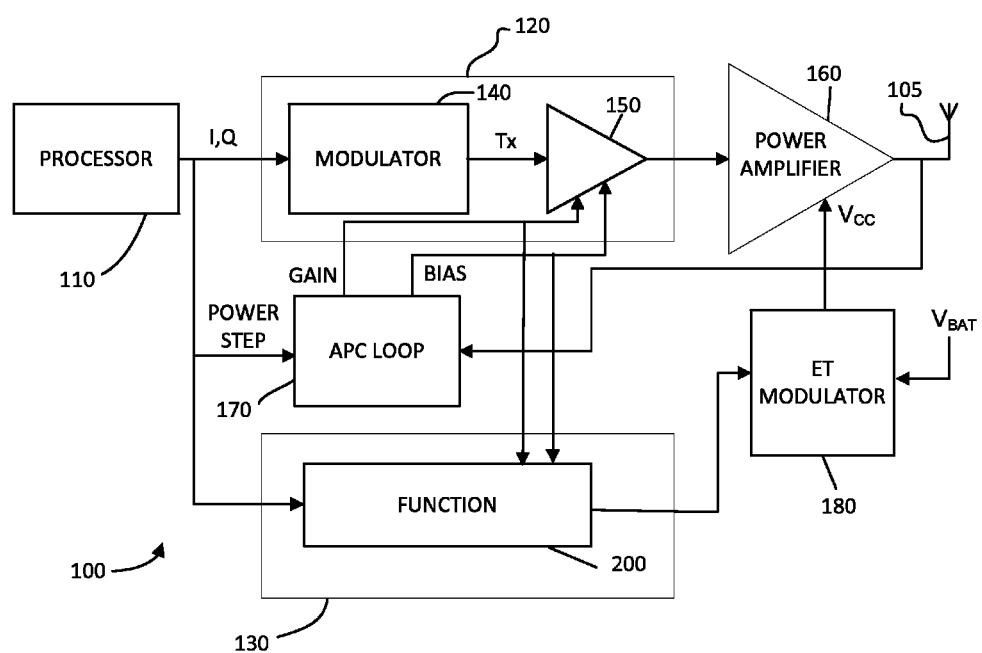
FIG. 2 is an illustration of a block diagram of a transmitter incorporating automatic power control and signal envelope tracking in accordance with an example embodiment.

However, in the embodiment of FIG. 2, gain scaling in the ET path 130 is guided by the APC loop 170, via the gain and bias signal outputs of the APC loop 170, which are then conditioned by a function block 200. The function block 200 includes a multiplier and a look up table (LUT) for calibrating the shape of the envelope tracking response. In one embodiment, block 200 may be implemented using circuitry that approximates an arbitrary function F(x), as described in commonly assigned U.S. patent application Ser. No. 13/525,506, filed on Jun. 18, 2012, the contents of which are incorporated herein by reference. The LUT implemented within block 200 stores values representing the desired shape of the envelope control signal addressed using a combination of the actual baseband signal (I, Q) and the gain and bias signals received from the APC loop 170. The output from the LUT is then applied to the ET modulator 180 for adjusting the power amplifier supply voltage Vcc for the power amplifier 160, as discussed above.

In one embodiment, the LUT may contain pre-calculated envelope shape values (i.e. a static table) that are addressed using the received gain and bias signal values. In other embodiments, function block 200 may execute a calibration routine that receives the gain and bias signals from the APC loop 170 and uses those signals to address the envelope tracking LUT. Also, the values stored in the LUT may represent either straight-line scaling of the envelope (i.e. upward scaling by increasing the slope of the line and downward scaling by decreasing the slope), or may represent a complex shape of the envelope through the use of higher order polynomials.

Figure 3:
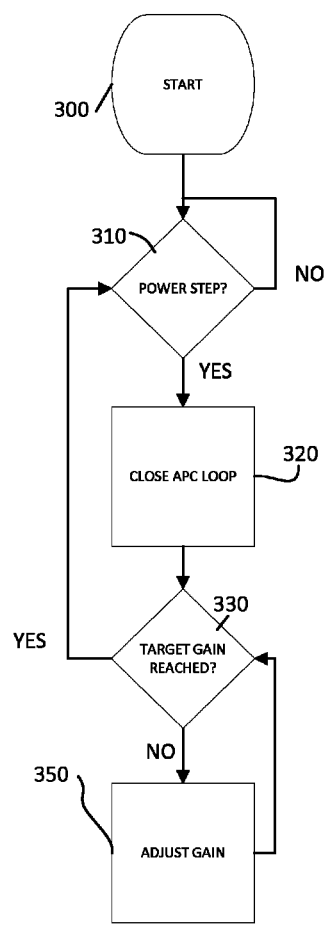
FIG. 3 illustrates a flow chart depicting a method for coordinating automatic power control and signal envelope tracking in accordance with the example embodiment of FIG. 2.

FIG. 3 is a flowchart depicting a method for coordinating automatic power control and signal envelope tracking in accordance with the example embodiment of FIG. 2. The method begins at step 300 and enters a wait state for receipt of a power step command from processor 110. Upon receipt of a power step command (a YES at step 310), the APC loop 170 is immediately closed (step 320). Upon closing the APC loop 170 the internal power controller is activated for tracking the power step and applying error correction (gain, bias) to the transmit path 120. This ensures that the output of power amplifier 160 accurately tracks the desired power step. Following activation of the APC loop 170 (i.e. closing the loop), the power amplifier output will track to the target output power, being guided by the APC loop 170, and stabilize once the loop settles.

A determination is made at step 330 as to whether or not the target gain set point for the power step has been reached within the APC path loop 170. If not (a NO at step 330) the gain is continually adjusted via the APC loop 170 and the determination step 330 is repeated until the target gain has been reached, as discussed above.

Once the target gain has been reached (a YES at step 330), the method returns to a wait state for the next power step command (step 310).

From FIG. 3, it will be appreciated that control signals (gain, bias) from the APC loop 170 effectively guide the ET path gain such that the APC loop simultaneously controls gain setting during the power transition in both the transmit path 120 and the ET path 130.

As discussed above in connection with the prior art, spectral discontinuities occur between the stages of ET scaling/gain change and closing of the APC loop 170. The method of FIG. 3 eliminates interim scaling of the ET path 130, thereby addressing the problem of spectral distortion during power steps.

The various embodiments presented above are merely examples and are in no way meant to limit the scope of this disclosure. Variations of the innovations described herein will be apparent to persons of ordinary skill in the art, such variations being within the intended scope of the present disclosure. In particular, features from one or more of the above-described embodiments may be selected to create alternative embodiments comprised of a sub-combination of features which may not be explicitly described above. In addition, features from one or more of the above-described embodiments may be selected and combined to create alternative embodiments comprised of a combination of features which may not be explicitly described above. Features suitable for such combinations and sub-combinations would be readily apparent to persons skilled in the art upon review of the present disclosure as a whole. The subject matter described herein and in the recited claims intends to cover and embrace all suitable changes in technology.

What is claimed is:

1. A transmitter for a mobile communication device, comprising:
   a processor configured to generate a baseband signal and a control signal;
   a transmit signal path having a modulator configured to up-convert the baseband signal to an RF signal, and a transmit output stage configured to pre-amplify the RF signal;
   a power amplifier configured to amplify the RF signal that has been pre-amplified;
   an antenna configured to transmit the RF signal that has been amplified;
   an envelope tracking signal path comprising a function block configured to convert an envelope of the baseband signal into a shaped envelope signal;
   an automatic power control loop configured to:
      in response to receipt of the control signal from the processor and a feedback signal from an output of the power amplifier,
      generate a gain control signal to adjust a gain of the transmit output stage and concurrently control the function block of the envelope tracking signal path to convert the envelope of said baseband signal into the shaped envelope signal; and
   an envelope tracking modulator configured to receive the shaped envelope signal from the function block and provide power for the power amplifier that changes based on the shaped envelope signal.

2. A transmitter as in claim 1, wherein said function block includes a lookup table containing pre-calculated envelope shape values, and wherein the envelope tracking signal path is further configured to convert the envelope of the baseband signal into the shape envelope signal based on one of the pre-calculated envelope shape values addressed by the gain control signal.

3. A transmitter as in claim 1, wherein said function block executes a calibration routine that uses said gain control signal received from the automatic power control loop to address a lookup table containing envelope shape values and wherein the envelope tracking signal path is further configured to convert the envelope of the baseband signal into the shape envelope signal based on one the pre-calculated envelope shape values addressed by the pain control signal.

4. A transmitter as in claim 3, wherein the pre-calculated envelope shape values represent straight-line scaling of the envelope of the baseband signal and wherein upward scaling is characterized by increasing the slope of the line and downward scaling is characterized by decreasing the slope of the line.

5. A transmitter as in claim 3, wherein the pre-calculated envelope shape values represent a complex envelope shape characterized by higher order polynomials.

6. A transmitter as in claim 1, wherein the automatic power control loop is further configured to, in response to receipt of the control signal from the processor and the feedback signal from the output of the power amplifier, generate a bias control signal to adjust a bias of the transmit output stage.

7. The transmitter of claim 1, wherein the automatic power control loop is further configured to:
   compare the feedback signal received from the output of the power amplifier to a target gain derived from the control signal;
   in response to determining that the feedback signal matches the target gain, cease generation of the gain control signal; and
   absent determining that the feedback signal matches the target gain, continue generation of the gain control signal.

8. A transmitter for a mobile communication device having a transmit signal path for up-converting and pre-amplifying a baseband signal to a preamplified RF signal, a power amplifier for amplifying the pre-amplified RF signal, an envelope tracking signal path for converting an envelope of the baseband signal into a shaped envelope signal, and an automatic power control loop configured to, in response to receipt of a control signal indicative of a change in power setting of the transmitter and a feedback signal from an output of the power amplifier, generate a gain control signal to adjust a gain of the transmit output stage, wherein the automatic power control loop is coupled to the envelope tracking signal path so that a function block of the envelope tracking path receives the gain control signal to concurrently control the conversion of the envelope of the baseband signal into the shaped envelope signal and the adjustment of the gain of the transmit output stage.

9. The transmitter of claim 8, wherein said function block of said envelope tracking signal path includes a lookup table containing pre-calculated envelope shape values, and wherein said envelope tracking signal path is further configured to convert said envelope of said baseband signal into said shaped envelope signal based on one of said pre-calculated envelope shape values addressed by said gain control signal.

10. The transmitter of claim 8, wherein said function block of the envelope tracking signal path executes a calibration routine that uses the gain control signal signal received from the automatic power control loop to address a lookup table containing envelope shape values and wherein the envelope tracking signal path is further configured to convert the envelope of the baseband signal into the shaped envelope signal based on one the pre-calculated envelope shape values addressed by the gain control signal.

11. The transmitter of claim 10, wherein said pre-calculated envelope shape value represent straight-line scaling of the envelope of the baseband signal and wherein upward scaling is characterized by increasing the slope of the line and downward scaling is characterized by decreasing the slope of the line.

12. The transmitter of claim 10, wherein the pre-calculated envelope shape values represent a complex envelope shape characterized by higher order polynomials.

13. The transmitter of claim 10, wherein the automatic power control loop is further configured to, in response to receipt of the control signal indicative of the change in power setting of the transmitter, generate a bias control signal to adjust a bias of the transmit output stage.

14. A method for controlling envelope tracking in a transmitter with closed loop power control, comprising
up-converting and pre-amplifying, using a modulator and a transmit output stage, a baseband signal to a preamplified RF signal;
amplifying, using a power amplifier, the pre-amplified RF signal;
converting, using an envelope tracking signal path comprising a function block, an envelope of the baseband signal into a shaped envelope signal;
generating a gain control signal using an automatic power control loop to adjust a gain of the pre-amplified RF signal and concurrently control the function block to convert the envelope of the baseband signal into the shaped envelope signal; and
adjusting a shape of the shaped envelope signal in response to changes in the gain of the pre-amplified RF signal.

15. The method of claim 14, wherein converting the envelope of the baseband signal into the shaped envelope signal includes addressing a lookup table containing precalculated envelope shape values using the gain control signal to retrieve one of the precalculated envelope shape values from the lookup table and converting the envelope of the baseband signal into the shaped envelope signal based on the one of the pre-calculated envelope shape values.

16. The method of claim 14, wherein converting the envelope of the baseband signal into the shaped envelope signal includes executing a calibration routine that uses the gain control signal to address a lookup table containing precalculated envelope shape values and converting the envelope of the baseband signal into the shaped envelope signal based on one of the pre-calculated envelope shape value addressed by the gain control signal.

17. The method of claim 15, wherein the precalculated envelope shape values represent straight-line scaling of the envelope of the baseband signal and wherein upward scaling is characterized by increasing the slope of the line and downward scaling is characterized by decreasing the slope of the line.

18. The method of claim 16, wherein the precalculated envelope shape values represent a complex envelope shape characterized by higher order polynomials.

19. The method of claim 14, further comprising:
receiving a feedback signal from an output of the power amplifier;
comparing the feedback signal to a target gain derived from the control signal;
in response to determining that the feedback signal matches the target gain, cease generation of the gain control signal;
absent determining that the feedback signal matches the target gain, continuing generation of the gain control signal.

* * * * *